(12) United States Patent  
Xu

(10) Patent No.: US 9,343,358 B1  
(45) Date of Patent: May 17, 2016

(54) THREE-DIMENSIONAL MEMORY DEVICE WITH STRESS COMPENSATION LAYER WITHIN A WORD LINE STACK

(71) Applicant: SANDISK TECHNOLOGIES, INC., Plano, TX (US)

(72) Inventor: Jiyin Xu, Yokkaichi (JP)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/628,741

(22) Filed: Feb. 23, 2015

(51) Int. Cl.  
*H01L 21/768* (2006.01)  
*H01L 21/04* (2006.01)  
*H01L 27/115* (2006.01)  
*H01L 21/77* (2006.01)  
*H01L 21/02* (2006.01)  
*H01L 21/762* (2006.01)

(52) U.S. Cl.  
CPC .... *H01L 21/76877* (2013.01); *H01L 21/02238* (2013.01); *H01L 21/76202* (2013.01); *H01L 27/1157* (2013.01); *H01L 27/11524* (2013.01); *H01L 27/11556* (2013.01); *H01L 27/11582* (2013.01)

(58) Field of Classification Search  
None  
See application file for complete search history.

(56) References Cited

U.S. PATENT DOCUMENTS

| 5,915,167 | A | 6/1999 | Leedy |
| 8,884,357 | B2 | 11/2014 | Wang et al. |
| 2004/0124452 | A1 | 7/2004 | Wellhausen et al. |
| 2012/0104340 | A1* | 5/2012 | Yoshimizu ........ H01L 27/11578 257/2 |
| 2012/0208347 | A1 | 8/2012 | Hwang et al. |
| 2013/0017629 | A1 | 1/2013 | Pyo et al. |
| 2015/0126007 | A1* | 5/2015 | Jang ................. H01L 21/28273 438/268 |
| 2015/0162343 | A1* | 6/2015 | Park ................. H01L 27/11582 257/329 |
| 2015/0236038 | A1* | 8/2015 | Pachamuthu ..... H01L 27/11582 257/326 |

OTHER PUBLICATIONS

Lee, G., "Challenges in 3D NAND", Flash Memory Summit 2013.*  
Endoh, et al., "Novel Ultra High Density Memory with a Stacked-Surrounding Gate Transistor (S-SGT) Structured Cell," IEDM Proc. (2001) 33-36.  
International Search Report and Written Opinion, International Application No. PCT/US2015/062775, issued Mar. 2, 2016, 12pgs.

* cited by examiner

*Primary Examiner* — Joseph Schoenholtz  
(74) *Attorney, Agent, or Firm* — The Marbury Law Group PLLC

(57) ABSTRACT

A first stack of alternating layers including first insulating layers and first sacrificial material layers is formed on a substrate. Dielectric oxide layers applying compressive stress are formed on the top surface of the first stack and on the bottom surface of the substrate. A second stack of alternating layers including second insulating layers and second sacrificial material layers is formed over the top dielectric oxide layer. After formation of lateral recesses by removal of the first and second sacrificial material layers, a bottom dielectric oxide layer is removed. A conductive material applying a tensile stress is deposited into the backside recesses to form electrically conductive layers. The compressive stress applied by the top dielectric oxide layer partially cancels the tensile stress applied by the electrically conductive layers, and reduces the curvature of the substrate that has a concave bottom surface.

31 Claims, 12 Drawing Sheets

THREE-DIMENSIONAL MEMORY DEVICE WITH STRESS COMPENSATION LAYER WITHIN A WORD LINE STACK

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of manufacturing a three-dimensional memory structure is provided. A first stack of alternating layers comprising first insulating layers and first sacrificial material layers is formed over a substrate. A top dielectric oxide layer is formed over the first stack, and a bottom dielectric oxide layer is formed on a bottom surface of the substrate. A second stack of alternating layers comprising second insulating layers and second sacrificial material layer is formed on the top dielectric oxide layer. A contact trench is formed through the second stack, the top dielectric oxide layer, and the first stack. Lateral recesses are formed by removing the first and second sacrificial material layers selective to the first and second insulating layers. The substrate is deformed through removal of the bottom dielectric oxide layer while the top dielectric oxide layer is not removed.

According to another aspect of the present disclosure, a monolithic three-dimensional memory device is provided, which comprises a first stack of alternating layers comprising first insulating layers and first electrically conductive layers and located over a substrate; a dielectric oxide layer located on the first stack and having a thickness greater than twice a maximum thickness of the first insulating layers; and a second stack of alternating layers comprising second insulating layers and second electrically conductive material layers and located on the dielectric oxide layer. The first and second electrically conductive layers apply a first type stress to the substrate. The dielectric oxide layer applies a second type stress to the substrate. One of the first type stress and the second type stress is tensile stress and another of the first type stress and the second type stress is compressive stress.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
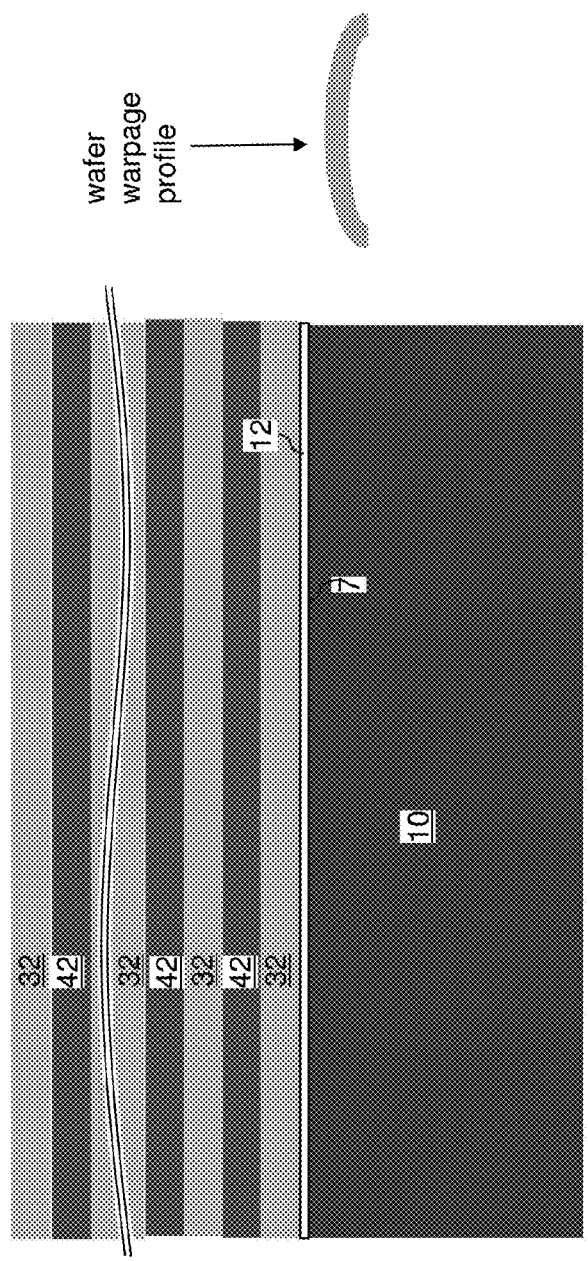
FIG. 1 is a vertical cross-sectional view of an exemplary structure after formation of a first stack including an alternating plurality of first insulating material layers and first sacrificial material layers according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate 10. The semiconductor substrate 10 comprises a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the semiconductor substrate 10. The major surface 7 can be a semiconductor surface. In one embodiment, the major surface 7 can be a single crystalline semiconductor surface. In one embodiment, the semiconductor substrate 10 can be a single crystalline silicon substrate.

As used herein, a "semiconductor substrate" refers to a substrate that includes at least one semiconductor material portion, and may consist of the at least one semiconductor material portion. As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the semiconductor substrate 10.

At least one semiconductor device (not shown) for a peripheral circuitry can be formed on a portion of the semiconductor substrate 10. The at least one semiconductor device can include, for example, field effect transistors. The at least one semiconductor device for the peripheral circuitry can contain a driver circuit for memory devices to be subsequently formed, which can include at least one NAND device. Optionally, a dielectric pad layer 12 or a dielectric etch stop layer (not shown) can be formed above the semiconductor substrate 10. The dielectric pad layer 12 can be, for example, a silicon oxide layer.

A stack of an alternating plurality of first material layers (which can be first insulating layers 32) and second material layers (which can be first sacrificial material layer 42) is formed over the top surface of the semiconductor substrate 10. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be a first insulating layer 32, and each second material layer can be a sacrificial material layer. In this case, the stack can include an alternating plurality of first insulating layers 32 and first sacrificial material layers 42.

The stack of the alternating plurality is herein referred to as a first stack (32, 42). In one embodiment, the first stack (32, 42) can include first insulating layers 32 composed of the first material, and first sacrificial material layers 42 composed of a second material different from that of first insulating layers 32. The first material of the first insulating layers 32 can be at least one insulating material. As such, each first insulating layer 32 can be an insulating material layer. Insulating materials that can be employed for the first insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 32 can be silicon oxide.

The second material of the first sacrificial material layers 42 is a sacrificial material that can be removed selective to the first material of the first insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 42 may comprise an insulating material, a semiconductor material, or a conductive material. The second material of the first sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 42 can be material layers that comprise silicon nitride or a semiconductor material including at least one of silicon and germanium.

In one embodiment, the first insulating layers 32 can include silicon oxide, and sacrificial material layers can include silicon nitride sacrificial material layers. The first material of the first insulating layers 32 can be deposited, for example, by chemical vapor deposition (CVD). For example, if silicon oxide is employed for the first insulating layers 32, tetraethyl orthosilicate (TEOS) can be employed as the precursor material for the CVD process. The second material of the first sacrificial material layers 42 can be formed, for example, CVD or atomic layer deposition (ALD).

Optionally, the first sacrificial material layers 42 can be suitably patterned so that conductive material portions to be subsequently formed by replacement of the first sacrificial material layers 42 can function as electrically conductive electrodes, such as the control gate electrodes of the monolithic three-dimensional NAND string memory devices to be subsequently formed. The first sacrificial material layers 42 may comprise a portion having a strip shape extending substantially parallel to the major surface 7 of the substrate.

The thicknesses of the first insulating layers 32 and the first sacrificial material layers 42 can be in a range from 20 nm to 50 nm, although lesser and greater thicknesses can be employed for each first insulating layer 32 and for each first sacrificial material layer 42. The number of repetitions of the pairs of a first insulating layer 32 and a first sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each first sacrificial material layer 42 in the first stack (32, 42) can have a uniform thickness that is substantially invariant within each respective first sacrificial material layer 42.

The stack of an alternating plurality of first insulating layers 32 and the first sacrificial material layer 42 is herein referred to as a first stack (32, 42). In one embodiment, the materials and thicknesses of the first insulating layers 32 and the first sacrificial material layers 42 can be selected such that the first stack (32, 42) applies a compressive stress to the semiconductor substrate 10. The compressive stress applied from the first stack (32, 42) to the semiconductor substrate 10 bends the exemplary structure such that the semiconductor substrate 10 develops a convex vertical profile. As used herein, a "convex vertical profile" refers to a vertical cross-sectional profile in which the center portion of an element (e.g., the substrate) is raised above the peripheral portion of the element in an "upright position" in which the memory device is located over the top side of the substrate, such that the top side of the substrate faces toward the memory device and the bottom side of the substrate faces away from the memory device. In contrast, a "concave vertical profile" refers to a vertical cross-sectional profile in which the center portion of an element is lowered below the peripheral portion of the element in the upright position. In other words, the "convex vertical profile" refers to a vertical cross-sectional profile in which the center portion of the substrate protrudes toward the memory device, while the "concave vertical profile" refers to a vertical cross-sectional profile in which the peripheral portion of the substrate protrudes toward the memory device.

Figure 2:
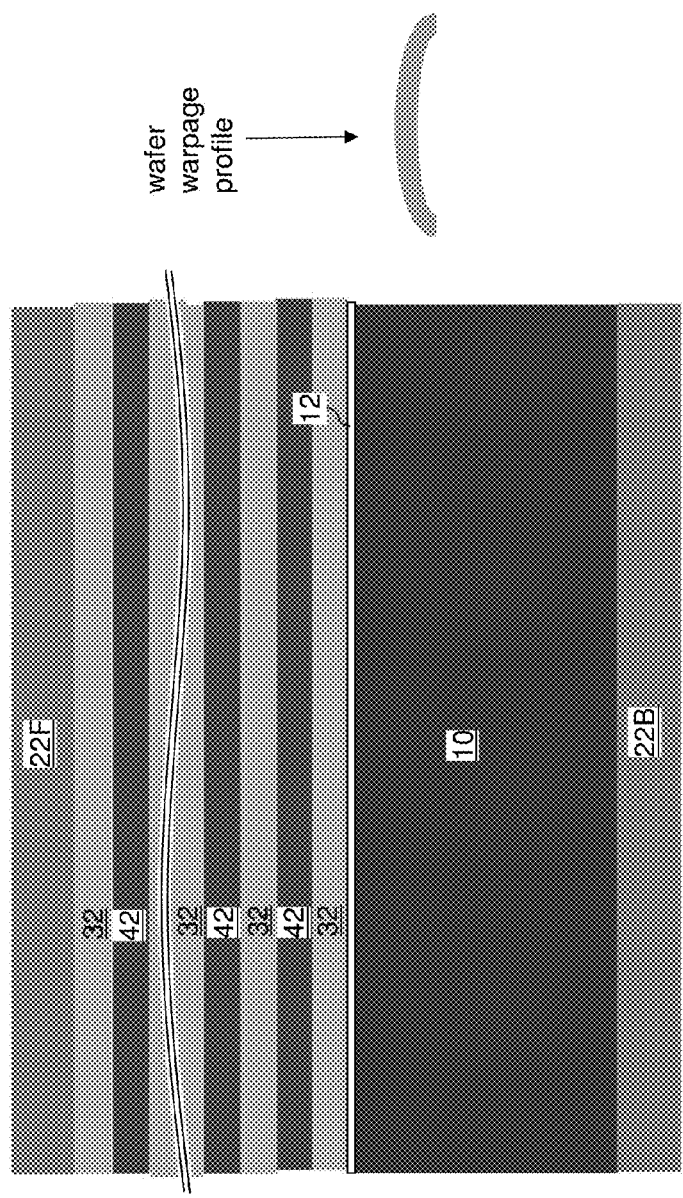
FIG. 2 is a vertical cross-sectional view of the exemplary structure after formation of semiconductor material layers on the top surface of the stack and the bottom surface of the substrate according to an embodiment of the present disclosure.

Referring to FIG. 2, semiconductor material layers (22F, 22B) are formed on the top surface of the first stack (32, 42) and the bottom surface of the semiconductor substrate 10. Specifically, a top semiconductor material layer 22F and a bottom semiconductor material layer 22B can be formed on the top surface of the first stack (32, 42) and on the bottom surface of the semiconductor substrate 10, respectively, by deposition of a semiconductor material. The semiconductor material can be any material that can be oxidized to form a dielectric oxide material. For example, the semiconductor material can comprise amorphous silicon, polysilicon, an amorphous alloy of silicon and at least one of germanium and carbon, or a polycrystalline alloy of silicon and at least one of germanium and carbon. In one embodiment, the semiconductor material can comprise amorphous silicon.

In one embodiment, the top semiconductor material layer 22F and the bottom semiconductor material layer 22B can be simultaneously formed by simultaneous deposition of the semiconductor material on the top surface of the first stack (32, 42) and on the bottom surface of the semiconductor substrate 10. In one embodiment, a conformal deposition process can be employed to form the top semiconductor material layer 22F and the bottom semiconductor material layer 22B. Exemplary conformal deposition processes include low pressure chemical vapor deposition (LPCVD) and atomic layer deposition (ALD). The thickness of the top semiconductor material layer 22F and the bottom semiconductor material layer 22B can be in a range from 35 nm to 350 nm, although lesser and greater thicknesses can also be employed.

Alternatively, the top semiconductor material layer 22F and the bottom semiconductor material layer 22B can be formed by two separate deposition processes that are sequentially performed. In this case, the thickness of the top semiconductor material layer 22F may, or may not, be the same as the thickness of the bottom semiconductor material layer 22B.

In one embodiment, the thickness of the top semiconductor material layer 22F can be selected such that the thickness of the dielectric oxide material derived from oxidation of the top semiconductor material layer 22 becomes greater than the maximum thickness of the first insulating layers 32 (for example, greater than twice the maximum thickness of the first insulating layers 32 or greater than three times the maximum thickness of the first insulating layers 32 or greater than five times the maximum thickness of the first insulating layers 32), such as between twice the maximum thickness of the first insulating layers 32 and ten times the maximum thickness of the first insulating layers 32. The top semiconductor material layer 22F and the bottom semiconductor material layer 22B can apply additional stress to the combination of the semiconductor substrate 10 and the first stack (32, 42). The additional stress from the top semiconductor material layer 22F and the bottom semiconductor material layer 22B have opposite effects on the combination of the semiconductor substrate 10 and the first stack (32, 42), and can be substantially cancelled out. In one embodiment, after deposition of the top semiconductor material layer 22F and the bottom semiconductor material layer 22B, the exemplary structure can have a convex vertical profile that is substantially the same as the convex vertical profile of the exemplary structure prior to deposition of the top semiconductor material layer 22F and the bottom semiconductor material layer 22B.

Figure 3:
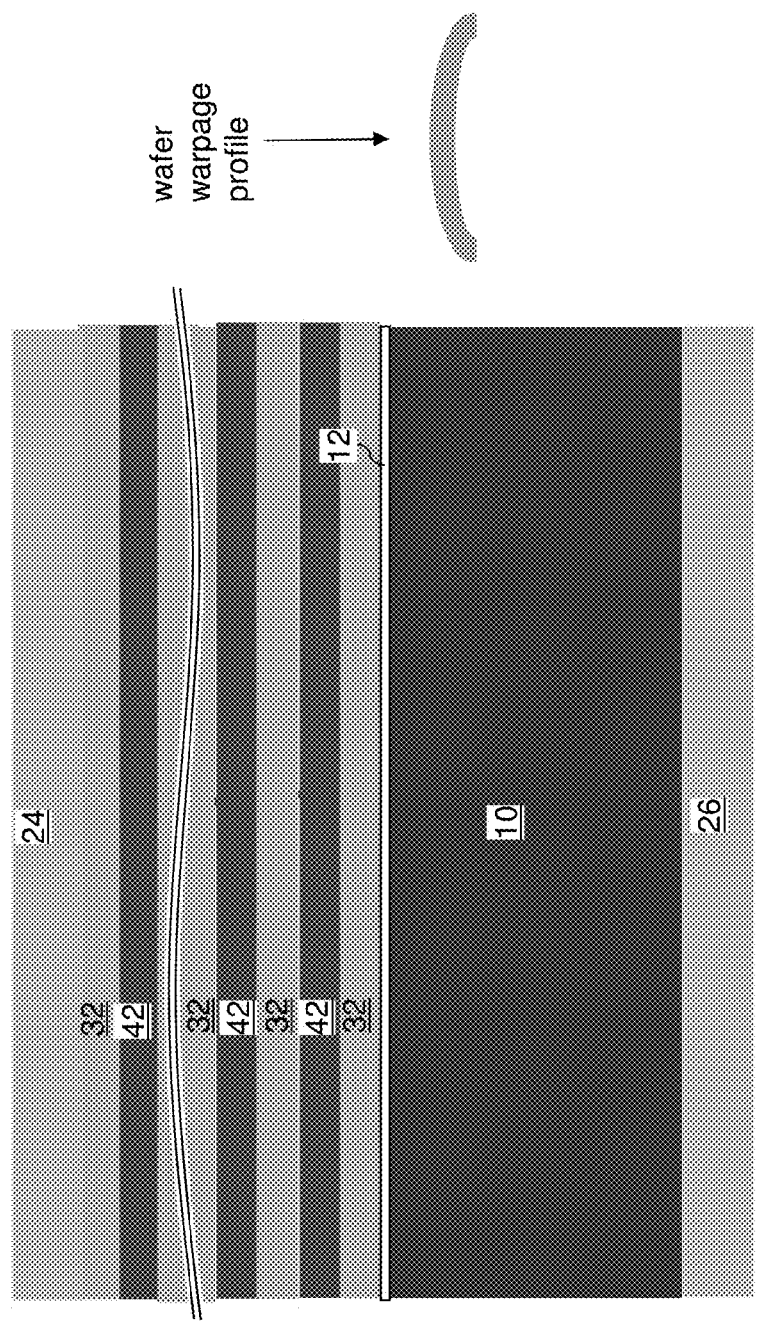
FIG. 3 is a vertical cross-sectional view of the exemplary structure after conversion of the semiconductor material layers into dielectric oxide layers according to an embodiment of the present disclosure.

Referring to FIG. 3, the top and bottom semiconductor material layers (22F, 22B) are converted, by an oxidation process, into a top dielectric oxide layer 24 and a bottom dielectric oxide layer 26, respectively. The top semiconductor material layer 22F is converted into a top dielectric oxide layer 24, and the bottom semiconductor material layer 22B is converted into a bottom dielectric oxide layer 26.

The conversion of the semiconductor material layers (22F, 22B) into the dielectric oxide layers (24, 26) can be performed simultaneously or sequentially. In one embodiment, a thermal oxidation process can be employed to convert the semiconductor material layers (22F, 22B) into the dielectric oxide layers (24, 26) simultaneously. A wet oxidation process or a dry oxidation process can be employed to convert the semiconductor material layers (22F, 22B) into the dielectric oxide layers (24, 26). Alternatively, a series of plasma oxidation processes can be employed to sequentially convert the top semiconductor material layer 22F into a top dielectric oxide layer 24, and the bottom semiconductor material layer 22B into a bottom dielectric oxide layer 26, respectively.

The volume of the semiconductor material layers (22F, 22B) can expand with the incorporation of oxygen atoms into the semiconductor material to form the dielectric oxide material during the conversion process(es). Thus, the thickness of the top dielectric oxide layer 24 can be greater than the thickness of the top semiconductor material layer 22F, and the thickness of the bottom dielectric oxide layer 26 can be greater than the thickness of the bottom semiconductor material layer 22B. If the thickness of the top semiconductor material layer 22F is the same as the thickness of the bottom semiconductor material layer 22B prior to the oxidation process(es), the thickness of the top dielectric oxide layer 24 can be the same as the thickness of the bottom dielectric oxide layer 26 after the oxidation process. In one embodiment, the thickness of the top dielectric oxide layer 24 and the thickness of the bottom dielectric oxide layer 26 can be in a range from 50 nm to 500 nm, and the thickness of the top dielectric oxide layer 24 can be in a range from twice the maximum thickness of the first insulating layers 32 to ten times the maximum thickness of the first insulating layers 32.

The top dielectric oxide layer 24 is formed over the first stack (32, 42), and the bottom dielectric oxide layer 24 is formed on the bottom surface of the semiconductor substrate 26. In one embodiment, the top dielectric oxide layer 24 and the bottom dielectric oxide layer 26 can have the same composition and the same thickness. In one embodiment, the top dielectric oxide layer 14 and the bottom dielectric oxide layer 26 can comprise a dielectric oxide of the same semiconductor material. In one embodiment, the semiconductor material comprises polysilicon or amorphous silicon, and the top dielectric oxide layer 24 and the bottom dielectric oxide layer 26 can comprise thermal silicon oxide, which consists essentially of silicon and oxide with a stoichiometric atomic ratio (which is 2.0) between the oxygen atoms and the silicon atoms.

Figure 4:
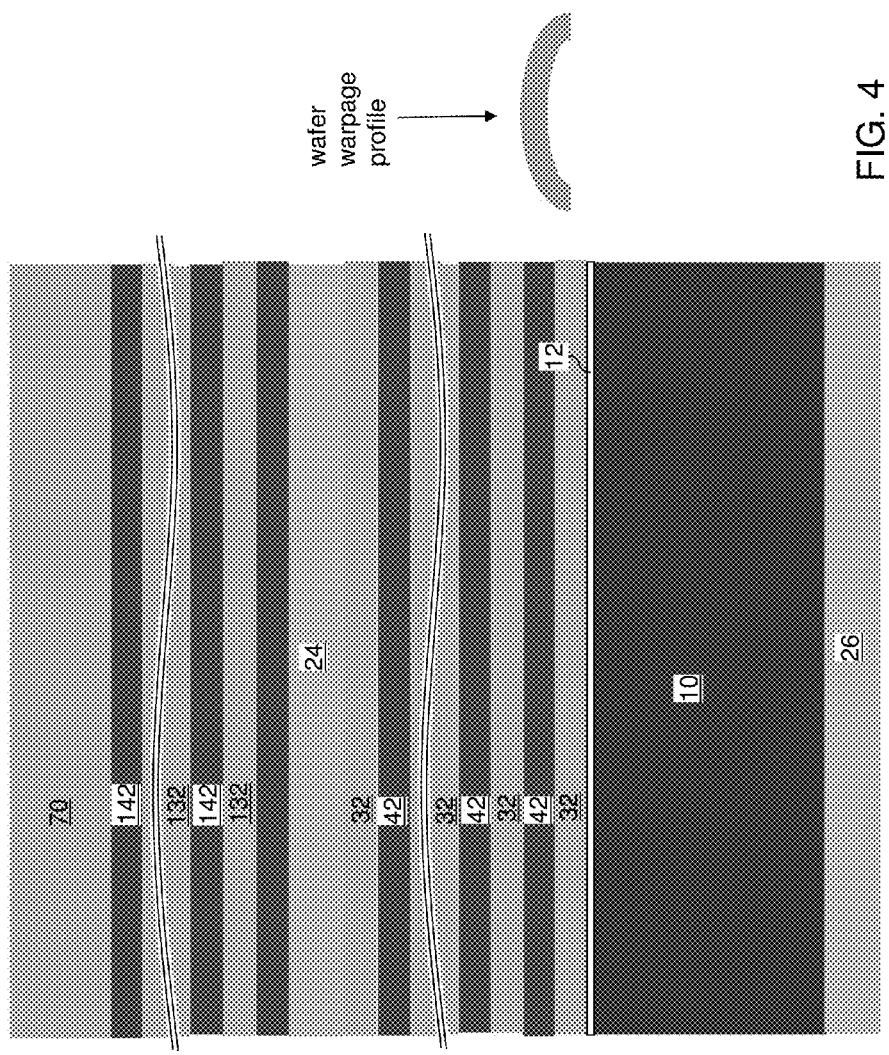
FIG. 4 is a vertical cross-sectional view of the exemplary structure after formation of a second stack including an alternating plurality of second insulating material layers and second sacrificial material layers according to an embodiment of the present disclosure.

Referring to FIG. 4, another stack of an alternating plurality of additional first material layers (which can be second insulating layers 132) and additional second material layers (which can be second sacrificial material layer 142) is formed over the top surface of the top dielectric oxide layer 24. The alternating plurality of additional first material layers and additional second material layers is herein referred to as a second stack (132, 142). The second stack (132, 142) may begin with an instance of the additional first material layer or with an instance of the additional second material layer, and may end with an instance of the first material layer or with an instance of the second material layer. Each additional first material layer includes the first material such as the material of the first insulating layers 32. Each additional second material layer includes the second material such as the material of the first sacrificial material layers 42.

In one embodiment, the second stack (32, 42) can include second insulating layers 132 composed of the first material, and second sacrificial material layers 142 composed of a the second material. The thicknesses of the second insulating layers 132 and the second sacrificial material layers 142 can be in a range from 20 nm to 50 nm, although lesser and greater thicknesses can be employed for each second insulating layer 132 and for each second sacrificial material layer 142. The number of repetitions of the pairs of a second insulating layer 132 and a second sacrificial material layer (e.g., a control gate electrode or a sacrificial material layer) 142 can be in a range from 2 to 1,024, and typically from 8 to 256, although a greater number of repetitions can also be employed. In one embodiment, each second sacrificial material layer 142 in the second stack (132, 142) can have a uniform thickness that is substantially invariant within each respective second sacrificial material layer 142.

In one embodiment, the materials and thicknesses of the second insulating layers 132 and the second sacrificial material layers 142 can be selected such that the second stack (132, 142) applies an additional compressive stress to the semiconductor substrate 10. The additional compressive stress applied from the second stack (132, 142) to the semiconductor substrate 10 bends the exemplary structure such that the convex vertical profile of the semiconductor substrate 10 becomes more severe. In other words, the center portion of the exemplary structure is raised above the peripheral portion of the exemplary structure to a greater degree by formation of the second stack (132, 142).

Optionally, an insulating cap layer 70 can be formed over the second stack (132, 142). The insulating cap layer 70 includes a dielectric material that is different from the material of the first and second sacrificial material layers (42, 142). In one embodiment, the insulating cap layer 70 can include a dielectric material that can be employed for the first and second insulating layers (32, 132) as described above. The insulating cap layer 70 can have a greater thickness than each of the first insulating layers 32 and the second insulating layers 132. The insulating cap layer 70 can be deposited, for example, by chemical vapor deposition. In one embodiment, the insulating cap layer 70 can be a silicon oxide layer. In one embodiment, the first and second insulating layers (32, 132) comprise silicon oxide, and the first and second sacrificial material layers (42, 142) comprise silicon nitride.

Figure 5:
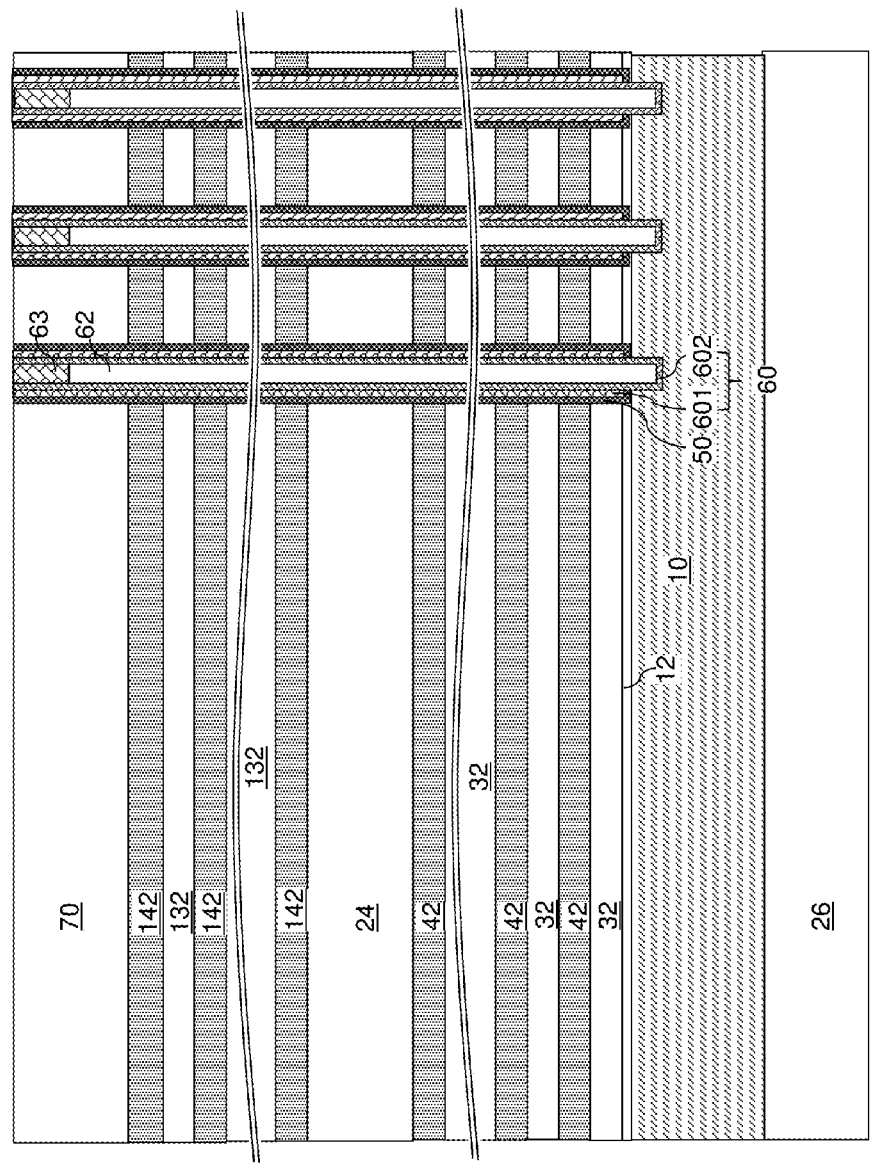
FIG. 5 is a vertical cross-sectional view of the exemplary structure after formation of memory openings and memory stack structures according to an embodiment of the present disclosure.

Referring to FIG. 5, a lithographic material stack (not shown) including at least a photoresist layer can be formed over the insulating cap layer 70, the second stack (132, 142), the top dielectric oxide layer 24, and the first stack (32, 42) to form openings therein. The pattern in the lithographic material stack can be transferred through the insulating cap layer 70, the second stack (132, 142), the top dielectric oxide layer 24, and the first stack (32, 42) by at least one anisotropic etch that employs the patterned lithographic material stack as an etch mask. Portions of the insulating cap layer 70, the second stack (132, 142), the top dielectric oxide layer 24, and the first stack (32, 42) underlying the openings in the patterned lithographic material stack are etched to form memory openings. In other words, the transfer of the pattern in the patterned lithographic material stack through the insulating cap layer 70, the second stack (132, 142), the top dielectric oxide layer 24, and the first stack (32, 42) forms the memory openings that extend to the semiconductor substrate 10. The chemistry of the anisotropic etch process employed to etch through the materials of the second stack (132, 142) and the first stack (32, 42) can alternate to optimize etching of the first and second materials in the first stack (32, 42) and the second stack (132, 142). The anisotropic etch can be, for example, a series of reactive ion etches. Optionally, a high-k dielectric material layer, if present, may be used as an etch stop layer between the first stack (32, 42) and the semiconductor substrate 10. The sidewalls of the memory openings can be substantially vertical, or can be tapered. The patterned lithographic material stack can be subsequently removed, for example, by ashing.

Each of the memory openings can include a sidewall (or a plurality of sidewalls) that extends substantially perpendicular to the topmost surface of the substrate. The region in which the array of memory openings is formed is herein referred to as a device region. In one embodiment, the memory openings can extend to a top surface of the semiconductor substrate 10.

A memory film 50 can be formed in each of the memory openings. The memory film 50 can include a stack, from outside to inside, of a blocking dielectric layer, a memory material layer, and a tunneling dielectric. The blocking dielectric layer can be formed on the sidewalls of the memory openings. Specifically, the blocking dielectric layer can contact the sidewalls of the first stack (32, 42), the top dielectric oxide layer 24, and the second stack (132, 142). The blocking dielectric layer may include one or more dielectric material layers that can function as the dielectric material(s) of a control gate dielectric between the control gate electrodes to be subsequently formed and charge storage regions to be subsequently formed as a portion of the memory film 50. The blocking dielectric layer can include silicon oxide, a dielectric metal oxide, a dielectric metal oxynitride, or a combination thereof. In one embodiment, the blocking dielectric layer can include a stack of at least one silicon oxide layer and at least one dielectric metal oxide layer. The blocking dielectric layer can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer can be in a range from 6 nm to 24 nm, although lesser and greater thicknesses can also be employed. Alternatively, the blocking dielectric layer may be omitted from the memory opening, and instead be formed in a subsequent processing step through a backside contact trench and backside recesses prior to forming electrically conductive layers.

The memory material layer can be formed on the sidewalls of the blocking dielectric layer within each memory opening. The memory material layer can comprise a charge storage layer that includes at least one charge storage element, which can be a plurality of charge storage elements. The charge storage layer includes a dielectric charge trapping material, which can be, for example, silicon nitride, or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles. The charge storage layer can be formed, for example, by chemical vapor deposition (CVD), atomic layer deposition (ALD), physical vapor deposition (PVD), or any suitable deposition technique for the selected material(s) for the charge storage layer. The thickness of the charge storage layer can be in a range from 2 nm to 20 nm, although lesser and greater thicknesses can also be employed.

The tunneling dielectric is subsequently formed on the memory material layer. The tunneling dielectric includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric can include a stack of a first silicon oxide layer, a silicon oxynitride layer, and a second silicon oxide layer, which is commonly known as an ONO stack. In one embodiment, the tunneling dielectric can include a silicon oxide layer that is substantially free of carbon or a silicon oxynitride layer that is substantially free of carbon. The thickness of the tunneling dielectric can be in a range from 2 nm to 20 nm, although lesser and greater thicknesses can also be employed. The blocking dielectric layer, the memory material layer, and the tunneling dielectric are collectively referred to as a memory film 50.

A first semiconductor layer 601 can be formed on each memory film 50. The first semiconductor layer 601 can be formed by depositing at least one semiconductor material on the inner sidewalls of the memory films 50 and on semiconductor surfaces of the doped semiconductor material layer 10 at the bottom of the memory openings. The semiconductor material of the first semiconductor layer 601 can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature.

An opening can be formed through each horizontal portion of the memory film 50 and the first semiconductor channel layer 601 at the bottom of the memory openings by an anisotropic etch. The horizontal portion of the memory film 50 and the first semiconductor channel layer 601 can be removed from above the top surfaces of the insulating cap layer 70 during the anisotropic etch. A top surface of the semiconductor substrate 10 is physically exposed at the bottom of each opening through the memory films 50 and the first semiconductor channel layers 601.

Subsequently, a second semiconductor channel layer 602 is deposited directly on the inner sidewall of the first semiconductor channel layer 601 within each memory opening and directly on the semiconductor substrate 10. An adjoining pair of a first semiconductor channel layer 601 and a second semiconductor channel layer 602 constitutes a semiconductor channel 60. A semiconductor channel 60 is formed within each memory opening and directly on the inner sidewall of the respective memory film 50. In one embodiment, each semiconductor channel 60 can extend through the second stack (132, 142), the top dielectric oxide layer 24, and the first stack (32, 42).

A dielectric core 62 can be formed within a cavity inside each semiconductor channel 60, for example, by deposition of a dielectric material such as silicon oxide, and subsequent planarization of the dielectric material. Planarization of the dielectric material can be performed to remove the portion of the deposited dielectric material from above the top surface of the horizontal plane including the top surface of the dielectric cap layer 70. The planarization of the dielectric material can be performed, for example, by chemical mechanical planarization. The remaining dielectric material portions can be recessed below the top surface of the upper stack structure, for example, by a recess etch. Each remaining portion of the dielectric material inside a memory opening constitutes a dielectric core 62. The dielectric core 62 is an optional component, and a combination of a memory film 50 and a semiconductor channel 60 may completely fill a memory opening.

A drain region 63 can be formed on the top portion of each semiconductor channel 60, for example, by deposition of a doped semiconductor material. If the semiconductor channels 60 comprise a doped semiconductor material, the conductivity type of the drain regions 63 can be the opposite of the conductivity type of the semiconductor channels 60 and a doped surface portion of the semiconductor substrate 10 in contact with the semiconductor channels 60. The semiconductor channels 60 and the doped surface portion of the semiconductor substrate 10 collectively constitute the channel of a vertical stack of field effect transistors embodied within a vertical memory stack structure such as a vertical NAND structure. Each set of a memory film 50 and a semiconductor channel 60 contacting the memory film 50 collectively constitutes a memory stack structure (50, 60) in which data can be stored in a plurality of vertically spaced memory elements.

Figure 6:
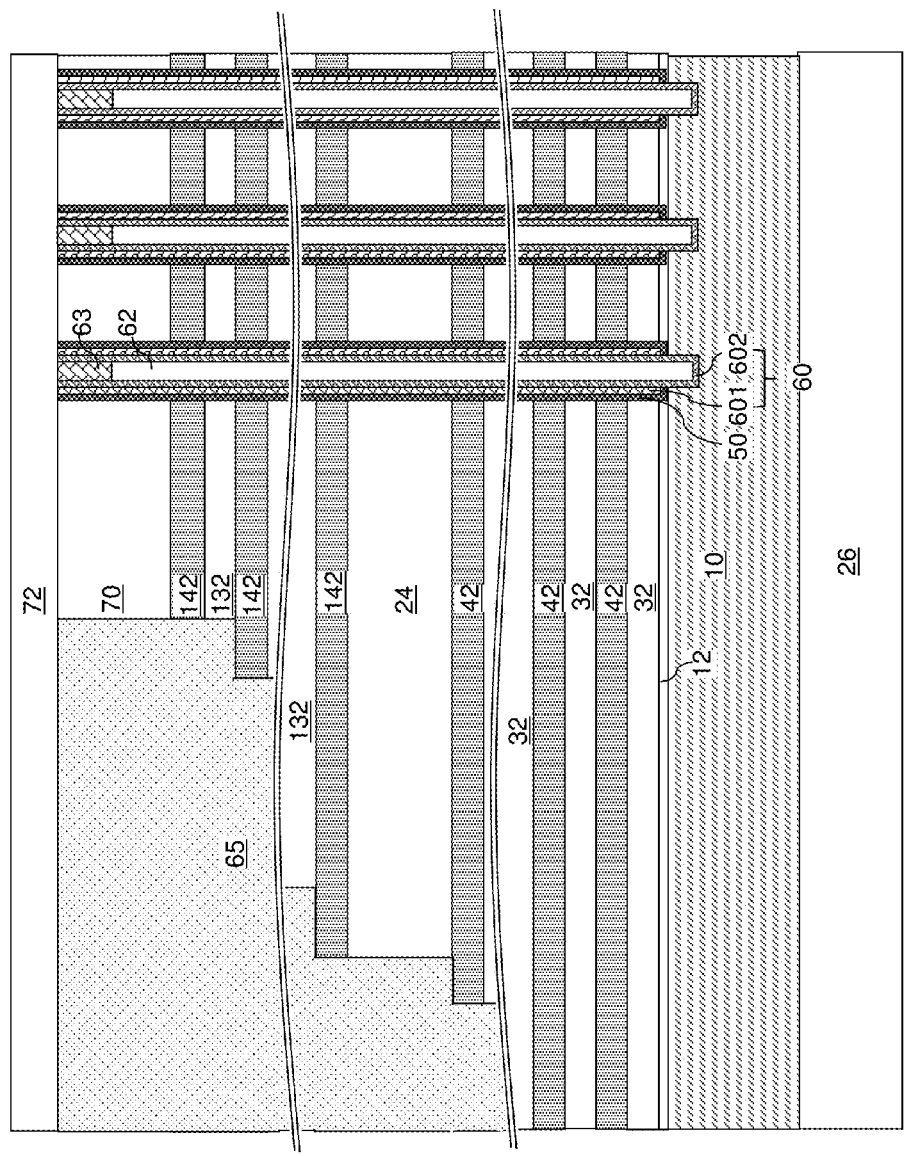
FIG. 6 is a vertical cross-sectional view of the exemplary structure after formation of stepped surfaces on the stacks of alternating layers and a retro-stepped dielectric material portion according to an embodiment of the present disclosure.

Referring to FIG. 6, portions of the dielectric cap layer 70, the second stack (132, 142), the top dielectric oxide layer 24, and the first stack (32, 42) can be removed, for example, by applying and patterning a photoresist layer with an opening and by transferring the pattern of the opening through the stack of the dielectric cap layer 70, the second stack (132, 142), the top dielectric oxide layer 24, and the first stack (32, 42) employing an etch such as an anisotropic etch.

A stepped cavity can be formed within a contact region, which is a region located outside of a device region including a plurality of memory stack structures (50, 60). The stepped cavity includes a set of stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces. The stepped cavity can have various stepped surfaces such that the horizontal cross-sectional shape of the stepped cavity changes in steps as a function of the vertical distance from the top surface of the semiconductor substrate 10.

In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The stepped cavity can be formed, for example, by forming a mask layer with an opening therein, etching a cavity within the levels of the dielectric cap layer 70, and iteratively expanding the etched area and vertically recessing the cavity by etching each vertically adjoining pair of a second sacrificial material layer 142 and a second insulating layer 132, a pair of the top semiconductor oxide layer 24 and the topmost first sacrificial material layer 42, and each vertically adjoining pair of a first sacrificial material layer 42 and a first insulating layer 32 that are located directly underneath the bottom surface of the etched cavity within the etched area. The second stack (132, 142) is patterned such that each underlying second sacrificial material layer 142 laterally protrudes farther than any overlying second sacrificial material layer 142 in the etched region, and each underlying second insulating layer 132 laterally protrudes farther than any overlying second insulating layer 132 in the etched region. The first stack (32, 42) is patterned such that each underlying first sacrificial material layer 42 laterally protrudes farther than any overlying first sacrificial material layer 42, any second insulating layer 132, and any second sacrificial material layer 142 in the etched region. Further, each underlying first insulating layer 32 laterally protrudes farther than any overlying first insulating layer 32, any second insulating layer 132, and any second sacrificial material layer 142 in the etched region.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the dielectric cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 7:
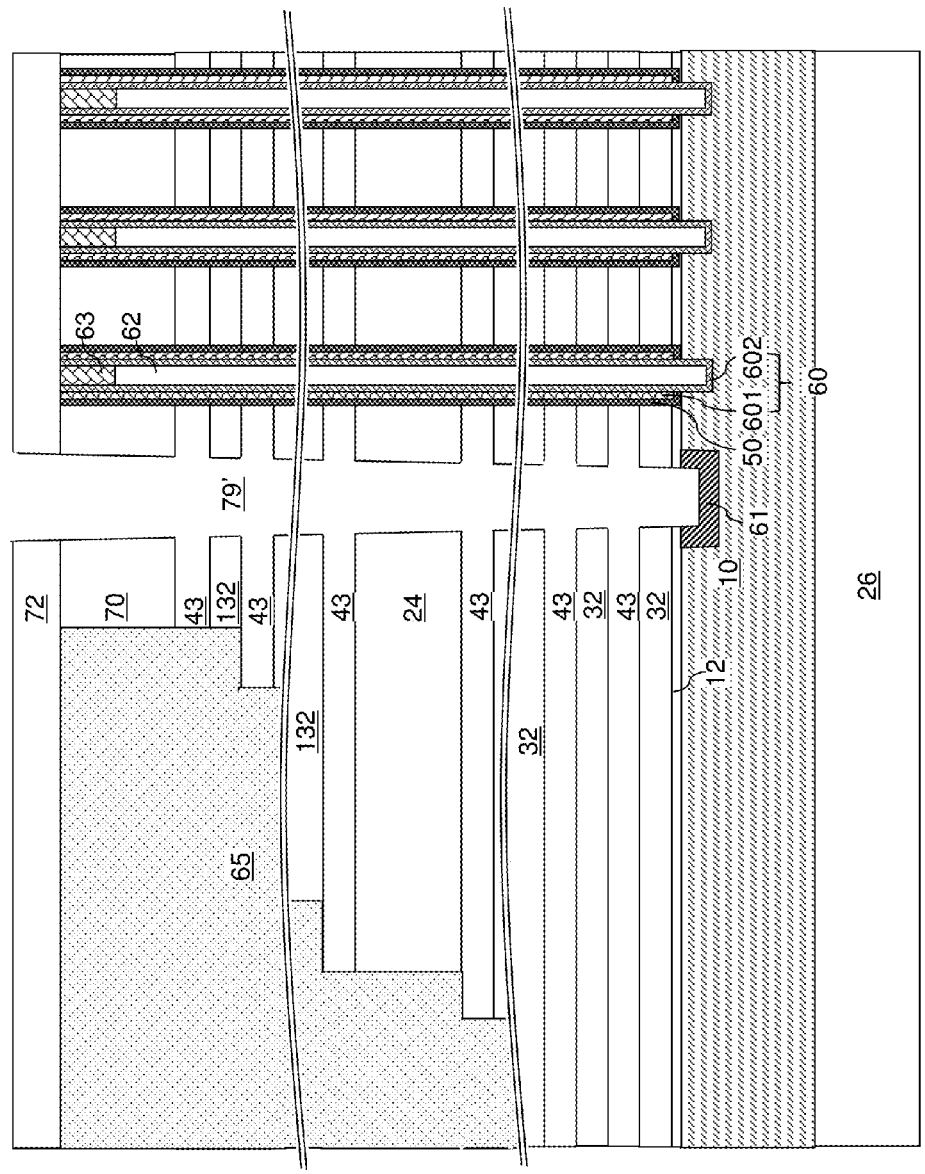
FIG. 7 is a vertical cross-sectional view of the exemplary structure after formation of a backside contact trench and backside recesses according to an embodiment of the present disclosure.

Referring to FIG. 7, a hard mask layer 72 can be optionally formed over the dielectric cap layer 70 and the retro-stepped dielectric material portion 65. The hard mask layer 72 comprises a material that is resistant to an etchant to be employed for subsequently remove the sacrificial materials of the first and second sacrificial material layers (42, 142). For example, the hard mask layer 72 can comprise the same material as the first and second insulating layers (32, 132). In one embodiment, the hard mask layer 72 can comprise silicon oxide.

A photoresist layer (not shown) can be applied over the hard mask layer 72 and lithographically patterned to form an opening therethrough. The pattern of the opening is transferred through the hard mask layer 72, the dielectric cap layer 70, the second stack (132, 142), the top dielectric oxide layer 24, and the first stack (32, 42) to form a backside contact trench 79 in an area in which formation of a backside contact via structure is desired. The transfer of the pattern in the photoresist layer can be performed employing at least one anisotropic etch. The backside contact trench 79 can extend to the top surface of the semiconductor substrate 10. The backside contact trench 79 is a contact trench that is formed on the outside, or the "backside," of the memory openings in which the memory stack structures (50, 60) are present.

Electrical dopants of the same conductivity type as the dopants in the drain regions 63 can be implanted to a surface portion of the semiconductor substrate 10 that underlies the backside contact trench 79, for example, by ion implantation. The implanted region of the semiconductor substrate 10 is converted into a source region 61. The photoresist layer can be removed, for example, by ashing.

An etchant that selectively etches the second material of the first and second sacrificial material layers (42, 142) with respect to the first material of the first and second insulating layers (32, 132) can be introduced into the at least one backside contact trench 79, for example, employing an isotropic etch process. Backside recesses 43 are formed in volumes from which the first and second sacrificial material layers (42, 142) are removed. The removal of the second material of the first and second sacrificial material layers (42, 142) can be selective to the first material of the first and second insulating layers (32, 132), the material of the retro-stepped dielectric material portion 65, the semiconductor material of the source region 61, and the material of the blocking material layers in the memory films 50. In one embodiment, the first and second sacrificial material layers (42, 142) can include silicon nitride, and the first and second insulating layers (32, 132) and the retro-stepped dielectric material portion 65 can be selected from undoped silicate glass (USG) and doped silicate glass. In another embodiment, the first and second sacrificial material layers (42, 142) can include a semiconductor material such as polysilicon or a silicon-germanium alloy, and the materials of the first and second insulating layers (32, 132) and the retro-stepped dielectric material portion 65 can be selected from undoped silicate glass (USG), doped silicate glass, silicon nitride, and dielectric metal oxides.

The etch process that removes the second material selective to the first material can be a wet etch process employing a wet etch solution, or can be a gas phase (dry) etch process in which the etchant is introduced in a vapor phase into the at least one backside contact trench 79. For example, if the first and second sacrificial material layers (42, 142) include silicon nitride, the etch process can be a wet etch process in which the exemplary structure is immersed within a wet etch tank including phosphoric acid, which etches silicon nitride selective to silicon oxide, silicon, and dielectric metal oxides.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the first and second sacrificial material layers (42, 142) is removed. The memory openings in which the memory stack structures (50, 60) are formed are herein referred to as front side recesses or front side cavities in contrast with the backside recesses 43. In one embodiment, the device region comprises an array of monolithic three-dimensional NAND strings having a plurality of device levels disposed above the semiconductor substrate 10. In this case, each backside recess 43 can define a space for receiving a respective word line of the array of monolithic three-dimensional NAND strings.

Each of the plurality of backside recesses 43 can extend substantially parallel to the top surface of the semiconductor substrate 10. A backside recess 43 can be vertically bounded by a top surface of an underlying insulating layer (32, 132, or 24) and a bottom surface of an overlying insulating layer (32, 132, 24, or 70). In one embodiment, each backside recess 43 can have a uniform height throughout.

Figure 8:
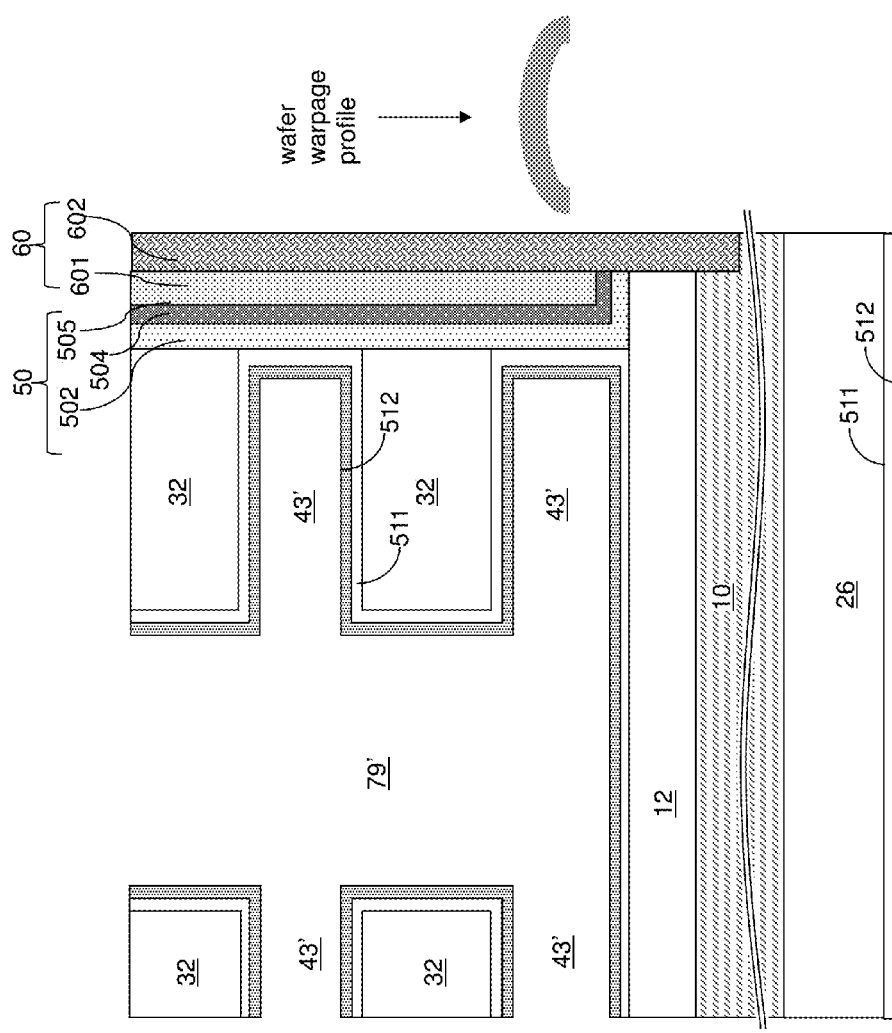
FIG. 8 is a magnified vertical cross-sectional view of a portion of the exemplary structure after deposition of backside blocking dielectric layers according to an embodiment of the present disclosure.

Referring to FIG. 8, an optional first backside blocking dielectric layer 511 and an optional second backside blocking dielectric layer 512 are sequentially formed within the backside recesses 43, within the backside contact trench 79, on the top surface of the hard mask layer 72, and on the bottom surface of the bottom dielectric oxide layer 26. The first backside blocking dielectric layer 511 can comprise a semiconductor oxide material such as silicon oxide. The first backside blocking dielectric layer 511 can be formed, for example, by a conformal deposition method such as chemical vapor deposition or atomic layer deposition. The thickness of the first backside blocking dielectric layer 511 can be in a range from 0.5 nm to 1 nm, although lesser and greater thicknesses can also be employed.

The second backside blocking dielectric layer 512 can comprise a dielectric metal oxide material such as aluminum oxide. The second backside blocking dielectric layer 512 can be formed, for example, by a conformal deposition method such as atomic layer deposition. The thickness of the second backside blocking dielectric layer 512 can be in a range from 0.5 nm to 2 nm, although lesser and greater thicknesses can also be employed. A vertical backside cavity 79' and lateral backside cavities 43' are present in the exemplary structure. The vertical backside cavity 79' is an unfilled portion of the backside contact trench 79, and each lateral backside cavity 43' is an unfilled portion of a backside recess 43.

The exemplary structure can have a convex vertical profile at this processing step. Thus, the center portion of the exemplary structure is raised above the peripheral portion of the exemplary structure after formation of the first backside blocking dielectric layer 511 and the second backside blocking dielectric layer 512. In one embodiment, the bottom surface of the semiconductor substrate 10 can have a convex surface from after formation of the first stack (32, 42) and until completion of the processing steps of FIG. 8.

Figure 9:
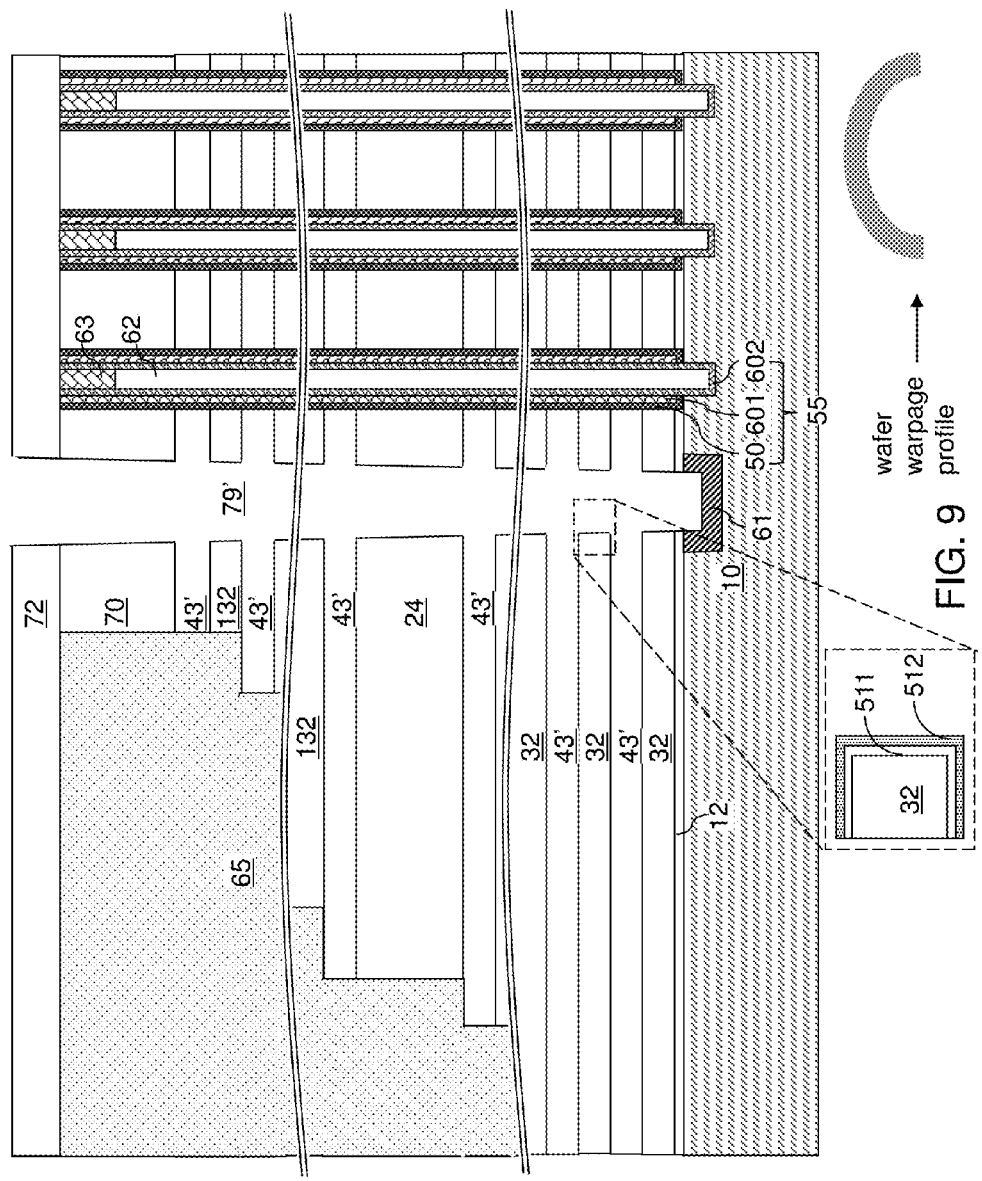
FIG. 9 is a vertical cross-sectional view of the exemplary structure after removal of a backside dielectric oxide layer according to an embodiment of the present disclosure.

Referring to FIG. 9, the dielectric materials on the bottom side of the semiconductor substrate 10 can be removed while preventing removal of dielectric materials from the top side of the semiconductor substrate 10. Specifically, the portion of the second backside blocking dielectric layer 512 underlying the semiconductor substrate 10 can be removed by an etch process while preventing removal of the second backside blocking dielectric layer 512 from above the semiconductor substrate 10. For example, an etchant chemical may be sprayed only onto the bottom side of the semiconductor substrate 10 while not being sprayed above the top surface of the semiconductor substrate 10. Alternatively, the exemplary structure may be placed upside down in a process chamber, and an anisotropic etch can be performed to remove the second backside blocking dielectric layer 512.

Further, the portion of the first backside blocking dielectric layer 511 underlying the semiconductor substrate 10 can be removed by an etch process while preventing removal of the first backside blocking dielectric layer 511 from above the semiconductor substrate 10. For example, an etchant chemical may be sprayed only onto the bottom side of the semiconductor substrate 10 while not being sprayed above the top surface of the semiconductor substrate 10. Alternatively, the exemplary structure may be placed upside down in a process chamber, and an anisotropic etch can be performed to remove the first backside blocking dielectric layer 511.

Subsequently, the bottom dielectric oxide layer 26 is removed from underneath the semiconductor substrate 10 by an etch process while preventing removal of dielectric material layers from above the semiconductor substrate 10. For example, an etchant chemical may be sprayed only onto the bottom side of the semiconductor substrate 10 while not being sprayed above the top surface of the semiconductor substrate 10. Alternatively, the exemplary structure may be placed upside down in a process chamber, and an anisotropic etch can be performed to remove the bottom dielectric oxide layer 26.

Each of the bottom dielectric oxide layer 26 and the top dielectric oxide layer 24 applies compressive stress to the semiconductor substrate 10 prior to removal of the bottom dielectric oxide layer 26. The removal of the bottom dielectric layer 26 removes the stress previously applied by the bottom dielectric oxide layer 26 to the semiconductor substrate 10. The semiconductor substrate 10 is thus deformed through removal of the bottom dielectric oxide layer while the top dielectric oxide layer 24 is not removed. The additional net compressive stress applied by the top dielectric oxide layer 24 (generated in the absence of the balancing compressive stress from the bottom dielectric oxide layer 26) further bends the exemplary structure such that the semiconductor substrate 10 develops a more convex vertical profile compared to the previous convex vertical profile at the processing steps of FIG. 8. In other words, removal of the bottom dielectric oxide layer deforms the semiconductor substrate 10 so that the bottom surface of the semiconductor substrate 10 becomes a concave surface with a greater concavity, i.e., with more bending.

While the first backside blocking dielectric layer 511 and the second backside blocking dielectric layer 512 are illustrated only within an inset of FIG. 9, it is understood that the first backside blocking dielectric layer 511 and the second backside blocking dielectric layer 512 are present on all surfaces of the first and second insulating layers (32, 132) that face the vertical backside cavity 79' and the lateral backside cavity 43' and on the top surface of the hard mask layer 72.

Figure 10:
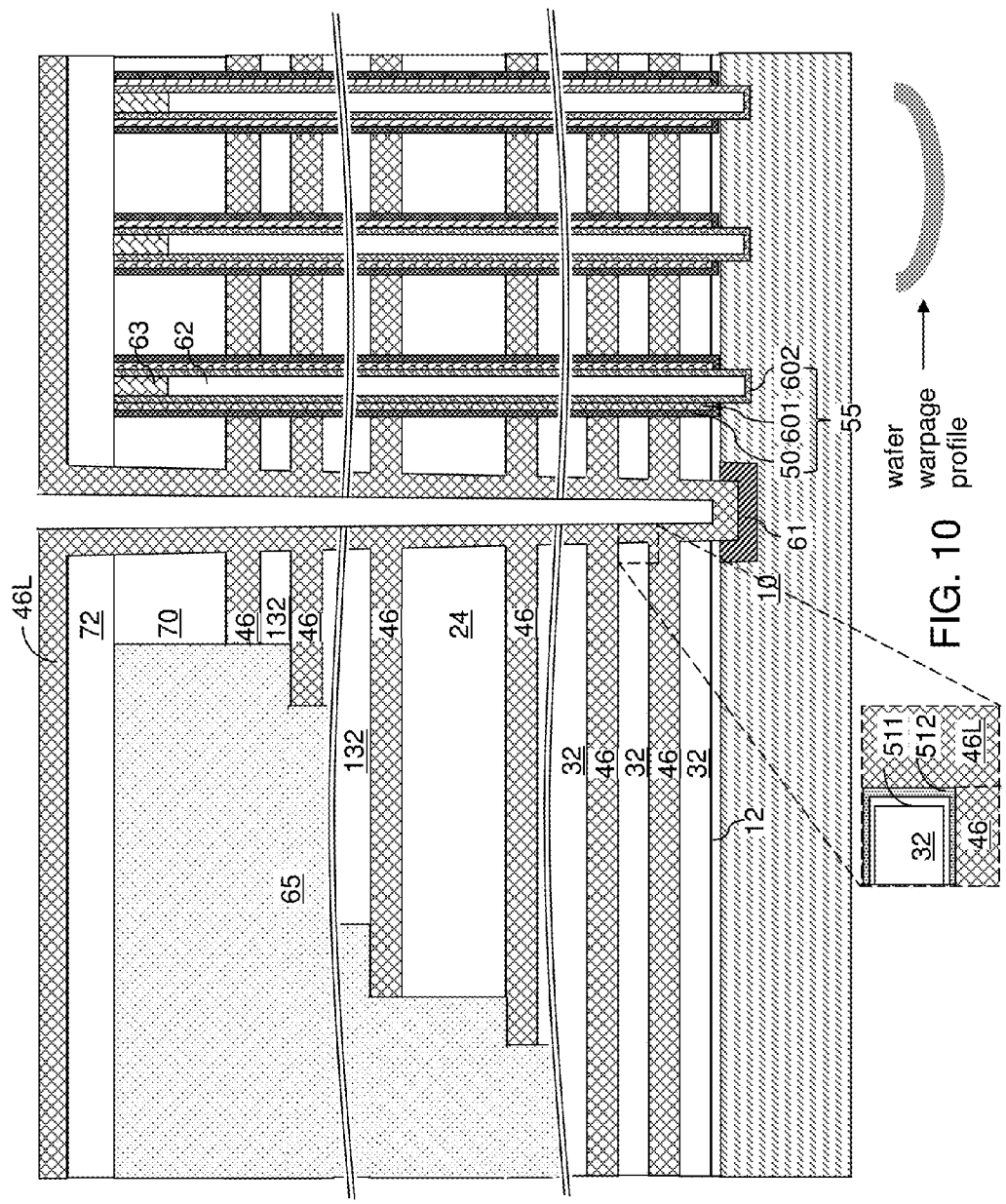
FIG. 10 is a vertical cross-sectional view of the exemplary structure after formation of electrically conductive layers according to an embodiment of the present disclosure.
Figure 11:
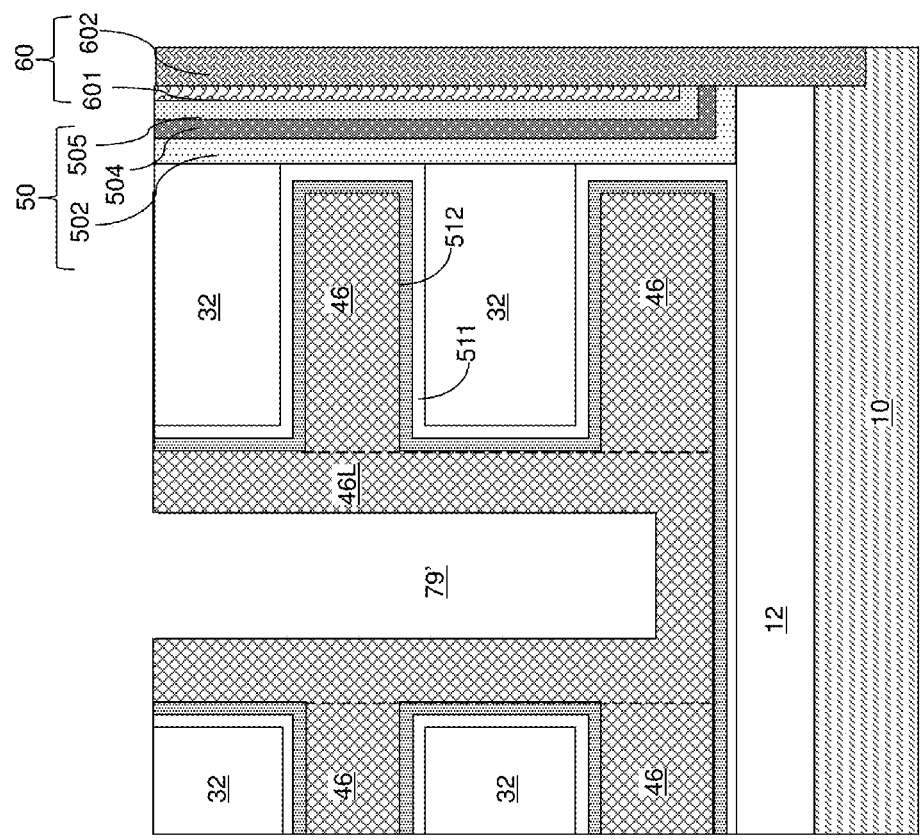
FIG. 11 is a magnified vertical cross-sectional view of a portion of the exemplary structure after formation of the electrically conductive layers according to an embodiment of the present disclosure.

Referring to FIGS. 10 and 11, at least one conductive material can be deposited in the vertical backside cavity 79' and the lateral backside cavities 43'. The at least one deposited conductive material in the backside recesses 43 constitute electrically conductive layers 46. A contiguous fill material layer 46L is formed in the backside contact trench 79 and over the hard mask layer 72. As used herein, a conductive material refers to an electrically conductive material. FIG. 11 illustrates that each memory film 50 can include a blocking dielectric layer 502, a memory material layer 504, and a tunneling dielectric 505, and the semiconductor channel 60 can comprise a first semiconductor channel layer 601 and a second semiconductor channel layer 602.

Each of the at least one conductive material of the electrically conductive layers 46 can be deposited by a conformal deposition method, which can be, for example, chemical vapor deposition (CVD), atomic layer deposition (ALD), electroless plating, electroplating, or a combination thereof. Each of the at least one conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of lateral backside cavities 43' include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition. In one embodiment, the at least one conductive material of the electrically conductive layers 46 comprises an elemental metal or an intermetallic alloy of at least two elemental metals. In one embodiment, the at least one conductive material can comprise tungsten.

In one embodiment, the at least one conductive material of the electrically conductive layers 46 can include a first conductive material including a conductive metallic nitride, and a second conductive material including an elemental metal or an intermetallic alloy of at least two elemental metals. The first conductive material can be deposited to form a contiguous metallic layer including the conductive metallic nitride. In one embodiment, the contiguous metallic layer can include TiN, TaN, WN, or a combination or and alloy thereof. The second conductive material can be deposited to form a conductive fill material layer including an elemental metal or an intermetallic alloy of at least two metallic elements. In one embodiment, the conductive fill material layer can include W, Cu, Au, Ag, Pt, or a combination thereof. The duration of the deposition process that forms the conductive fill material layer can be selected such that all remaining unfilled volumes of the backside recesses 43 are filled with the conductive material of the conductive fill material layer, while a non-zero volume of the vertical backside cavity 79' is present within an unfilled volume of the backside contact trench after the deposition process.

In one embodiment, the exemplary structure can be a device comprising a vertical NAND device, and at least one of the electrically conductive layers 46 in the stack of the first and second insulator layers (32, 132) and the electrically conductive layers 46 can comprise, or can be electrically connected to, a word line of the vertical NAND device.

Formation of the electrically conductive layers 46 introduces tensile stress to the portion of the exemplary structure located above the top surface of the semiconductor substrate 10. The vertical cross-sectional profile of the exemplary structure becomes a concave vertical profile, i.e., a vertical profile in which the center portion of the exemplary structure is lowered below the peripheral portion of the exemplary structure. Accordingly, the top surface of the semiconductor substrate 10 becomes a concave surface, and the bottom surface of the semiconductor substrate 10 becomes a convex surface.

Figure 12:
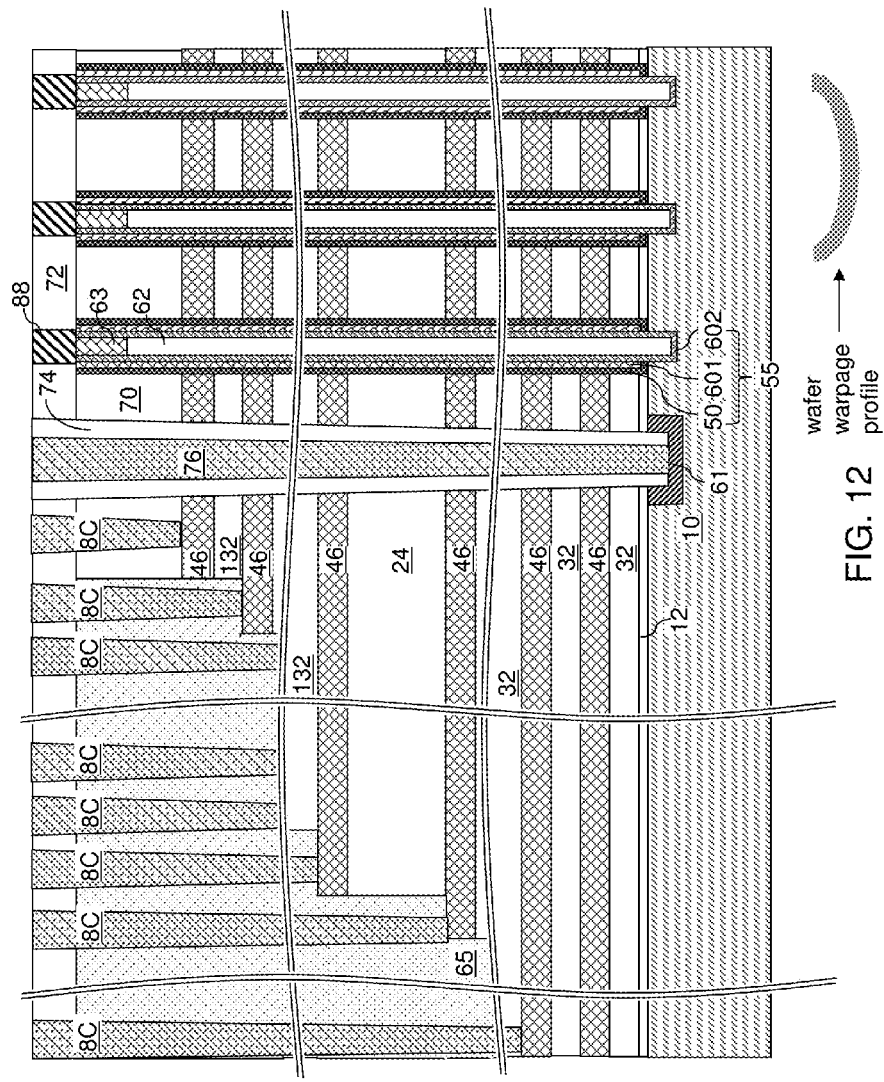
FIG. 12 is a vertical cross-sectional view of the exemplary structure after formation of a backside contact via structure and control gate contact via structures according to an embodiment of the present disclosure.

Referring to FIG. 12, the deposited conductive materials of the contiguous fill material layer 46L can be etched back from the sidewalls of each backside contact trench 79 and from above the hard mask layer 72, for example, by an isotropic etch. The electrically conductive layers 46 are present within a stack (32, 132, 24, 46) of material layers.

An insulating spacer 74 can be formed on the sidewall of the backside contact trench 79 by deposition and anisotropic etching of an insulating material layer. In one embodiment, the insulating spacer 74 includes a dielectric material such as silicon oxide, silicon nitride, organosilicate glass, a dielectric metal oxide, a dielectric metal oxynitride, or a combination thereof. In one embodiment, the insulating spacer 74 can comprise a silicon oxide layer. The thickness of the insulating spacer 74 can be in a range from 5 nm to 100 nm, although lesser and greater thicknesses can also be employed.

At least one conductive material can be deposited in the contiguous cavity 79'. The at least one conductive material can include a conductive metallic nitride material, an elemental metal, an intermetallic alloy of at least one elemental metal, a metal semiconductor alloy such as a metal silicide, a doped semiconductor material, or a combination thereof. In one embodiment, the at least one conductive material can include a combination of a conductive metallic nitride material and a metallic material including at least one elemental metal. The at least one conductive material can be deposited, for example, by physical vapor deposition, chemical vapor deposition, electroplating, electroless plating, or a combination thereof. The at least one conductive material can fill the vertical backside cavity 79'.

Excess portions of the at least one conductive material can be removed from above the topmost layer of the exemplary structure, for example, by chemical mechanical planarization. The remaining portion of the at least one conductive material that is surrounded by the insulating spacer 74 constitutes a backside contact via structure 76, which can be a source contact via structure that provides electrical contact to the source region 61.

Various additional contact via structures (8C, 88) can be formed through the hard mask layer 72, and optionally through the retro-stepped dielectric material portion 65 to provide electrical contact to the electrically conductive layers 46 and the drain regions 63. The formation of the various additional contact via structures (8C, 88) may be performed prior to, concurrently with, or after formation of the backside contact via structures 76. The additional contact via structures (8C, 88) can include drain contact via structures 88 and control gate contact via structures 8C. Each drain contact via structures 88 can provide electrical contact to drain regions 63 of the vertical field effect transistors that incorporate the memory stack structures 55. Each control gate contact via structures 8C contacts an electrically conductive layer 46, which can function as a control gate electrode for the vertical field effect transistors that incorporate the memory stack structures 55.

Additional metal interconnect structures (not shown) including at least one conductive via structure and at least one additional conductive line structure can be optionally formed in at least one additional dielectric material layer. The additional metal interconnect structure can be formed on the top surface of the backside contact via structure 76 and the various additional contact via structures (8C, 88).

While the present disclosure is described employing an embodiment in which the first and second insulator layers (32, 132) apply a compressive stress, and the electrically conductive layers apply a tensile stress, embodiments are expressly contemplated herein in which the polarity of the two types of stress is reversed by selection of a pair of suitable materials for the insulator layers (32, 132) and the electrically conductive layers 46.

The exemplary structure comprises a monolithic three-dimensional memory device, which comprises a first stack of alternating layers comprising first insulating layers 32 and first electrically conductive layers (a first subset of the electrically conductive layers 46 located underneath the top dielectric oxide layer 24) and located over a substrate (such as the semiconductor substrate 10); a dielectric oxide layer (such as the top dielectric oxide layer 24) located on the first stack and having a thickness greater than twice a maximum thickness of the first insulating layers 32; a second stack of alternating layers comprising second insulating layers 132 and second electrically conductive material layers (a second subset of the electrically conductive layers 46 located above the top dielectric oxide layer 24) and located on the dielectric oxide layer 24; a contact trench (such as the backside contact trench 79) extending through the second stack, the top dielectric oxide layer 24, and the first stack; and a contact via structure (such as the backside contact via structure 76) located within the contact trench. The first and second electrically conductive layers 46 apply a first type stress to the substrate 10; the dielectric oxide layer 24 applies a second type stress to the substrate; and one of the first type stress and the second type stress is tensile stress and another of the first type stress and the second type stress is compressive stress.

It is believed that since the dielectric oxide layer 24 is formed by conversion of an existing silicon layer 22F, such as a polysilicon layer or amorphous silicon layer, it applies the second type of stress to the substrate. In contrast, an as-deposited oxide layer, such as a silicon oxide layer deposited by CVD may not necessarily apply the second type of stress to the substrate. In one embodiment, the dielectric oxide layer 24 is in tensile stress and applies compressive stress to the substrate 10, and the electrically conductive layers 46 are in compressive stress and apply tensile stress to the substrate 10. In one embodiment, the entirety of the bottom surface of the substrate 10 can have a convex surface. In one embodiment, the first and second electrically conductive layers 46 comprise an elemental metal or an intermetallic alloy of at least two elemental metals. In one embodiment, the first and second electrically conductive layers 46 comprise tungsten. In one embodiment, the dielectric oxide layer 24 comprises a dielectric oxide of a semiconductor material. In one embodiment, the dielectric oxide of the semiconductor material comprises silicon oxide.

An insulating spacer 74 can contact a sidewall of the contact trench, and the contact via structure 76 can be located within the insulating spacer. At least one memory stack structure 55 can extend through the second stack (132, 46), the dielectric oxide layer 24, and the first stack (32, 46). Each of the at least one memory stack structure 55 can comprise: a memory film 50 contacting a sidewall of a memory opening that extends through the second stack (132, 46), the dielectric oxide layer 24, and the first stack (32, 46); and a semiconductor channel 60 contacting the memory film 50 and a respective portion of a semiconductor material in the substrate 10. The memory film 50 can comprise: a blocking dielectric layer 502 (See FIG. 8) contacting the sidewall of the memory opening; at least one charge storage element (such as the memory material layer 504) located on an inner sidewall of the blocking dielectric layer 502; and a tunneling dielectric 505 located on the at least one charge storage element.

In one embodiment, the device located on the semiconductor substrate can include a vertical NAND device located in the device region, and at least one of the electrically conductive layers 46 in the stack (32, 132, 24, 46) can comprise, or can be electrically connected to, a word line of the NAND device. The device region can include a plurality of semiconductor channels (601, 602). At least one end portion of each of the plurality of semiconductor channels (601, 602) extends substantially perpendicular to a top surface of the semiconductor substrate. The device region further includes a plurality of charge storage regions located within each memory film 50. Each charge storage region is located adjacent to a respective one of the plurality of semiconductor channels (601, 602). The device region further includes a plurality of control gate electrodes having a strip shape extending substantially parallel to the top surface of the semiconductor substrate 10. The plurality of control gate electrodes comprise at least a first control gate electrode located in the first device level and a second control gate electrode located in the second device level. The plurality of electrically conductive layers 46 in the stack (32, 132, 24, 46) can be in electrical contact with, or can comprise, the plurality of control gate electrodes, and extends from the device region to a contact region including a plurality of electrically conductive contact via structures.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a three-dimensional memory structure, comprising:
 forming a first stack of alternating layers comprising first insulating layers and first sacrificial material layers over a substrate;
 forming a top dielectric oxide layer over the first stack and a bottom dielectric oxide layer on a bottom surface of the substrate;
 forming a second stack of alternating layers comprising second insulating layers and second sacrificial material layer on the top dielectric oxide layer;
 forming a contact trench through the second stack, the top dielectric oxide layer, and the first stack;
 forming lateral recesses by removing the first and second sacrificial material layers selective to the first and second insulating layers; and
 deforming the substrate through removal of the bottom dielectric oxide layer while the top dielectric oxide layer is not removed.

2. The method of claim 1, further comprising forming electrically conductive layers by filling the lateral recesses with a conductive material.

3. The method of claim 2, wherein:
 removal of the bottom dielectric oxide layer deforms the substrate so that the bottom surface of the substrate becomes a concave surface; and
 formation of the electrically conductive layers causes the bottom surface of the substrate to become a convex surface.

4. The method of claim 3, wherein the top dielectric oxide layer and the bottom dielectric oxide layer have a same composition and a same thickness.

5. The method of claim 3, wherein the conductive material comprises an elemental metal or an intermetallic alloy of at least two elemental metals.

6. The method of claim 5, wherein the conductive material comprises tungsten.

7. The method of claim 3, wherein the top dielectric oxide layer and the bottom dielectric oxide layer comprises a dielectric oxide of a semiconductor material.

8. The method of claim 3, wherein the top dielectric oxide layer and the bottom dielectric oxide layer are formed by:
 depositing a semiconductor material on the substrate, wherein a top semiconductor material layer is formed over the first stack and a bottom semiconductor material layer is formed on a bottom surface of the substrate; and
 converting by oxidation the top and bottom semiconductor material layers into respective top dielectric oxide layer and bottom dielectric oxide layer at the same time.

9. The method of claim 8, wherein the semiconductor material comprises polysilicon or amorphous silicon.

10. The method of claim 3, wherein the bottom surface of the substrate has a convex surface after formation of the bottom dielectric oxide layer and prior to removal of the bottom dielectric oxide layer.

11. The method of claim 2, further comprising:
 removing portions of the conductive material from the contact trench;
 forming an insulating spacer on a sidewall of the contact trench; and
 forming a contact via structure within the insulating spacer.

12. The method of claim 1, wherein the first and second insulating layers comprise silicon oxide, and the first and second sacrificial material layers comprise silicon nitride.

13. The method of claim 1, further comprising forming at least one memory stack structure through the second stack, the top dielectric oxide layer, and the first stack prior to formation of the contact trench.

14. The method of claim 13, wherein the at least one memory stack structure is formed by:
 forming at least one memory opening through the second stack, the top dielectric oxide layer, and the first stack;
 forming a memory film in each of the at least one memory opening; and
 forming a semiconductor channel contacting a semiconductor material in the substrate on each of the memory film.

15. The method of claim 14, wherein each memory film is formed by:
 forming a blocking dielectric layer on a sidewall of one of the at least one memory opening;
 forming at least one charge storage element on an inner sidewall of the blocking dielectric layer; and
 forming a tunneling dielectric directly on the at least one charge storage element.

16. The method of claim 1, further comprising forming a device on the substrate by filling the lateral recesses with electrically conductive layers, wherein:
 the device comprises a vertical NAND device; and
 at least one of the electrically conductive layers in the stack comprises, or is electrically connected to, a word line of the vertical NAND device.

17. The method of claim 16, wherein:
 the substrate comprises a silicon substrate;
 the monolithic three-dimensional NAND memory structure comprises an array of monolithic three-dimensional NAND strings over the silicon substrate;
 at least one memory cell in a first device level of the array of monolithic three-dimensional NAND strings is located over another memory cell in a second device level of the array of monolithic three-dimensional NAND strings;
 the silicon substrate contains an integrated circuit comprising a driver circuit for the memory device located thereon; and
 each NAND string comprises:
  a plurality of semiconductor channels, wherein at least one end portion of each of the plurality of semiconductor channels extends substantially perpendicular to a top surface of the substrate;
  a plurality of charge storage elements, each charge storage element located adjacent to a respective one of the plurality of semiconductor channels; and
  a plurality of control gate electrodes having a strip shape extending substantially parallel to the top surface of the substrate, the plurality of control gate electrodes comprise at least a first control gate electrode located in the first device level and a second control gate electrode located in the second device level.

18. A monolithic three-dimensional memory device, comprising:

a first stack of alternating layers comprising first insulating layers and first electrically conductive layers and located over a substrate;

a dielectric oxide layer located on the first stack and having a thickness greater than twice a maximum thickness of the first insulating layers;

a second stack of alternating layers comprising second insulating layers and second electrically conductive material layers and located on the dielectric oxide layer, wherein:

the first and second electrically conductive layers apply a first type stress to the substrate;

the dielectric oxide layer applies a second type stress to the substrate; and one of the first type stress and the second type stress is tensile stress and another of the first type stress and the second type stress is compressive stress.

19. The monolithic three-dimensional memory device of claim 18, wherein the dielectric oxide layer applies compressive stress to the substrate, and the electrically conductive layers apply tensile stress to the substrate.

20. The monolithic three-dimensional memory device of claim 18, wherein an entirety of a bottom surface of the substrate has a convex surface.

21. The monolithic three-dimensional memory device of claim 18, wherein the first and second electrically conductive layers comprise an elemental metal or an intermetallic alloy of at least two elemental metals.

22. The monolithic three-dimensional memory device of claim 21, wherein the first and second electrically conductive layers comprise tungsten.

23. The monolithic three-dimensional memory device of claim 18, wherein the dielectric oxide layer comprises a dielectric oxide of a semiconductor material.

24. The monolithic three-dimensional memory device of claim 23, wherein the dielectric oxide of the semiconductor material comprises silicon oxide.

25. The monolithic three-dimensional memory device of claim 18, further comprising:
 a contact trench extending through the second stack, the top dielectric oxide layer, and the first stack; and
 a contact via structure located within the contact trench.

26. The monolithic three-dimensional memory device of claim 25, further comprising an insulating spacer contacting a sidewall of the contact trench, wherein the contact via structure is located within the insulating spacer.

27. The monolithic three-dimensional memory device of claim 18, further comprising at least one memory stack structure extending through the second stack, the dielectric oxide layer, and the first stack.

28. The monolithic three-dimensional memory device of claim 27, wherein each of the at least one memory stack structure comprises:

a memory film contacting a sidewall of a memory opening that extends through the second stack, the dielectric oxide layer, and the first stack; and a semiconductor channel contacting the memory film and a respective portion of a semiconductor material in the substrate.

29. The monolithic three-dimensional memory device of claim 28, wherein the memory film comprises:
 a blocking dielectric layer contacting the sidewall of the memory opening;
 at least one charge storage element located on an inner sidewall of the blocking dielectric layer; and
 a tunneling dielectric located on the at least one charge storage element.

30. The monolithic three-dimensional memory device of claim 18, wherein:
 the monolithic three-dimensional memory device comprises a vertical NAND device; and
 the electrically conductive layers in the stack comprise, or are electrically connected to, a respective word line of the vertical NAND device.

31. The monolithic three-dimensional memory device of claim 30, wherein:
 the substrate comprises a silicon substrate;
 the monolithic three-dimensional NAND memory structure comprises an array of monolithic three-dimensional NAND strings over the silicon substrate;
 at least one memory cell in a first device level of the array of monolithic three-dimensional NAND strings is located over another memory cell in a second device level of the array of monolithic three-dimensional NAND strings;
 the silicon substrate contains an integrated circuit comprising a driver circuit for the memory device located thereon; and
 each NAND string comprises:
  a plurality of semiconductor channels, wherein at least one end portion of each of the plurality of semiconductor channels extends substantially perpendicular to a top surface of the substrate;
  a plurality of charge storage elements, each charge storage element located adjacent to a respective one of the plurality of semiconductor channels; and
  a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *